(12) United States Patent
Lee

(10) Patent No.: US 8,878,112 B2
(45) Date of Patent: Nov. 4, 2014

(54) SOLAR POWER GENERATING APPARATUS AND SOLAR TRACKING METHOD

(75) Inventor: Boo-Youl Lee, Euiwang-si (KR)

(73) Assignee: O'Solar Ltd., Seoul (KR)

( * ) Notice: Subject to any disclaimer, the term of this patent is extended or adjusted under 35 U.S.C. 154(b) by 477 days.

(21) Appl. No.: 13/380,714

(22) PCT Filed: Jul. 9, 2009
(Under 37 CFR 1.47)

(86) PCT No.: PCT/KR2009/003769
§ 371 (c)(1),
(2), (4) Date: Nov. 20, 2012

(87) PCT Pub. No.: WO2011/002123
PCT Pub. Date: Jan. 6, 2011

(65) Prior Publication Data
US 2013/0098445 A1    Apr. 25, 2013

(30) Foreign Application Priority Data
Jun. 29, 2009    (KR) .................. 10-2009-0058215

(51) Int. Cl.
| G01C 21/02 | (2006.01) |
| F24J 2/38 | (2014.01) |
| G01S 3/786 | (2006.01) |
| H01L 31/042 | (2014.01) |
| H01L 31/052 | (2014.01) |
| F24J 2/54 | (2006.01) |

(52) U.S. Cl.
CPC .............. *H01L 31/052* (2013.01); *Y02E 10/52* (2013.01); *F24J 2002/5468* (2013.01); *Y02E 10/47* (2013.01); *G01S 3/7861* (2013.01); *H01L 31/0422* (2013.01); *F24J 2/541* (2013.01); *F24J 2/38* (2013.01)
USPC .................... 250/203.4; 126/576; 136/246

(58) Field of Classification Search
USPC .......... 250/203.4; 136/244–246; 126/573–576
See application file for complete search history.

(56) References Cited

U.S. PATENT DOCUMENTS

| 6,465,725 B1 | 10/2002 | Shibata et al. | |
| 2010/0307479 A1* | 12/2010 | Park | 126/601 |
| 2011/0120523 A1* | 5/2011 | Silver | 136/246 |
| 2012/0198884 A1* | 8/2012 | Golben | 62/615 |
| 2013/0146123 A1* | 6/2013 | Park | 136/246 |

FOREIGN PATENT DOCUMENTS

| JP | 2006521009 A | 9/2006 |
| KR | 1020080102885 A | 11/2008 |

OTHER PUBLICATIONS

International Search Report mailed on Jul. 22, 2010 regarding PCT/KR2009/003769; 4 pages.

* cited by examiner

*Primary Examiner* — Seung C Sohn
(74) *Attorney, Agent, or Firm* — Armstong Teasdale LLP

(57) ABSTRACT

A solar power generating apparatus and a solar tracking method for the same. When a plurality of solar collector plates are arranged, the solar collector plates may be adjusted at certain rotation angles to maintain a high level of solar absorption efficiently with respect to shade, and errors caused by the installed positions (particularly, the installed directions) of the solar collector plates having solar cells can be compensated for, to accordingly calculate and determine adjustment angles in order to accurately rotate the solar cells or solar collector plates to a desired direction and to increase solar absorption efficiency.

19 Claims, 6 Drawing Sheets

SOLAR POWER GENERATING APPARATUS AND SOLAR TRACKING METHOD

REFERENCE TO RELATED APPLICATIONS

This application is a 371 National Stage application based on PCT/KR2009/003769, filed Jul. 9, 2009, which is based on Korean Application KR 10-2009-0058215, filed Jun. 29, 2009.

FIELD

The present invention is related to a solar power generation apparatus. More specifically, the present invention is related to a solar power generation apparatus and its tracking method which tracks the sunlight by changing the angle of the solar panel.

BACKGROUND

Recently, the development of a variety of energy substitution such as, a clean energy source and environment friendly energy are emerging to replace fossil fuels due to the shortage of fossil fuels, environmental contamination issues and etc. One of the solutions is to use solar energy. This type of solar energy use can be categorized into three types; one of the types converts solar energy to heat energy and uses it for heating or boiling water. The converted heat energy can also be used to operate a generator to generate electric energy. The second type is used to condense sunlight and induce it into fiber optics which is then used for lighting. The third type is to directly convert light energy of the sun to electric energy using solar cells.

In any case, in order to use solar energy, it is necessary to have a device to collect the solar energy. For an energy collection device, a solar panel, which will directly face the direct sunlight, is generally used. This type of solar panel has a structure of multiple solar cells laying on a flat surface structure or has conduits to circulate operating fluids and its efficiency depends on the elevation of the sun.

Additionally, to face the sun correctly, a program or device to track the sun is necessary. This is called a sunlight tracking system or tracking system. The method to track the sunlight can generally be categorized as a method of using a sensor or a method of using a program. First of all, the method of using a sensor has an advantage of having a simple structure but the scope of sensing the location of the sun is limited and when a certain amount of time has passed while the sun is blocked by clouds and the sun has passed the sensing range of the sensor, it is impossible to track the sun.

Accordingly, a method of using a tracking program has been developed. Even though it has the disadvantage of needing a compensatory step due to an accumulation of errors, it has the advantage of being able to track the sun regardless of weather conditions. This type of method is used to track the location of the sun by programming the sun's location by observing the sun's changing location due to the earth's spin and rotation around the sun in a tilted state.

On the other hand, the said tracking system can be categorized as a one-axis system or two-axis system depending on the number of rotational axes and is designed to gain maximum efficiency by adjusting the angle of the solar panel automatically or manually depending on the elevation of the sun based on measured or previously gathered data.

On the other hand, in terms of a power generation system using solar energy, a large number of solar panels are generally installed on a vast area of flat land and as it is impossible to install more than two panels of solar panels to overlap, a vast space of land is required. Because of this, the power transmission structure that delivers power generated from a generator or an actuator to each solar panel is complex and the power loss during the transmission is greater as well.

But, when multiple solar panels are installed, a shade can occur due to interference between the solar panels, and sunlight cannot be fully absorbed when the sun does not arise above a certain angle or due to weather conditions.

In addition, even if the power generation apparatus and its tracking system according to traditional technology is tracking the location of the sun according to the pre-determined programming, there is a problem of errors due to the installation location of solar panels which include said solar cells and particularly with the direction of the installation. In other words, there is an issue of a lower rate of sunlight absorption due to environmental problems such as the land where the solar power generation apparatus is installed and the difference between true north and magnetic north.

DETAILED DESCRIPTION

Figure 1:
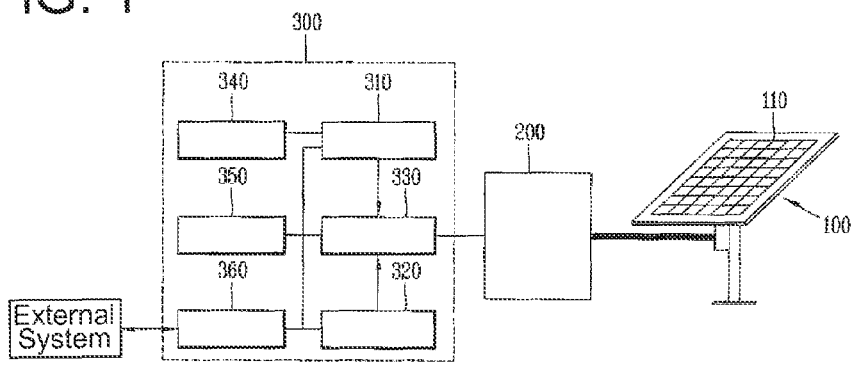
FIG. 1 is a schematic block diagram of a solar power generation apparatus according to the present invention.

The current invention is to solve said problems and deliver a solar power generation apparatus and its tracking method where it improves its solar absorption rate by controlling the solar panel's rotational angle when multiple solar panels are installed.

In addition, another purpose is to deliver a solar power generation apparatus and its tracking method where it rotates its solar cells or solar panels correctly to a desired direction depending on the elevation and angle of the sun and its azimuth.

In addition, another purpose is to deliver a solar power generation apparatus and its tracking method where it improves the solar absorption rate by rotating the solar cells or solar panels in relation to sun's elevation and its azimuth thus compensating for the error due to its installation location and especially installation direction of the solar panel which houses the solar cells.

Technical Solutions

A Solar power generation apparatus and its tracking method, according to the present invention, in order to accomplish said purposes is characterized by having one or more solar panels which contains one or more solar cells to absorb sunlight, a rotational angle processing unit which processes a rotational angle to rotate said solar panel in order to maintain the solar cell to a constant angle to said sun based on the elevation of the sun and its azimuth, a differential angle processing unit which processes the differential angle between the installation direction of said solar panel and true north, a control angle processing unit which processes a control angle based on said rotational angle and differential angle, a drive unit which rotates said solar panel according to said control angle and the said control angle processing unit determines whether one of the solar panels is creating shade to another solar panel and when it is determined that shade is occurring, it performs a shade avoiding mode. In addition, said control angle processing unit compares said control angle to a tracking limit angle and outputs said control angle to said drive unit or starts shade avoiding mode depending on the comparison result. In addition, the said control angle processing unit outputs said control angle to said a drive unit when said control angle is greater than said tracking limit angle and is less than 180°—tracking limit angle, and performs shade avoiding mode when said control angle is less than said tracking limit angle or larger than 180°—tracking limit angle. In here, said shade avoiding mode is a mode which rotates said solar panel to a pre-determined control angle for pre-determined duration or can be a mode which rotates said panel to a lesser angle than said tracking limit angle to absorb sunlight and when said absorbed sunlight is above a certain sunlight amount it stops said solar panel. Said constant angle is controlled so the solar panel is perpendicular to sunlight. In addition, said constant angle can be determined by the combination of one or two conditions from time of sunrise, time of sunset, the distance between solar panels, the location of solar panels, the size of sunlight and its related weather data.

In addition, the present invention is comprised of a communication unit which can communicate with an external system wirelessly or wired. Said elevation of the sun and its azimuth can be determined by the information received from the external weather observation system.

In addition, the present invention can additionally be comprised of a memory unit which can store the date, time, location and its related weather data and said elevation of the sun and its azimuth can be processed based on the stored date, time, location and its related weather data. The elevation of the sun and its azimuth based on said date, time and location and its related weather data can be pre-programmed into the memory unit.

In addition, the present invention can additionally be comprised of an input-output unit which can receive commands externally and send current statuses externally and said input-output unit can particularly be a display unit which can receive commands from the screen and displays current status to the screen.

Solar power generation apparatus and its tracking method, according to the present invention, in order to accomplish said purposes, has one or more solar panels and is characterized by having a rotational angle processing step which processes the rotational angle to maintain said cell's constant angle to said sun based on the elevation of the sun and its azimuth, a differential angle processing step which processes a differential angle between the direction of said solar cell and true north, a control angle processing step which processes a control angle based on said rotational angle and differential angle, a driving step which changes the direction of said solar cell depending on the said control angle, a comparison step which compares said control angle and pre-determined tracking limit angle and a drive step to change the direction of said solar cell based on said comparison result. It is here, the said drive step is characterized by changing the direction of said solar cell according to said limiting angle when said control angle is greater than said tracking limit angle and is less than 180°—tracking limit angle, and performs a shade avoiding mode when said control angle is less than said tracking limit angle or larger than 180°—tracking limit angle.

It is here, that the said shade avoiding mode is a mode which rotates said solar panel to a pre-determined control angle for a pre-determined duration or can be a mode which rotates said panel to a lesser angle than said tracking limit angle to absorb sunlight and when said absorbed sunlight is above a certain sunlight amount it stops said solar panel.

Said elevation of the sun and its azimuth can be determined by the received information from the external weather observation system or can be determined by pre-stored date, time and location or can be processed based on weather data from these elements. In addition, said constant angle can be determined by the combination from one or two conditions from time of sunrise, time of sunset, the distance between solar panels, the location of solar panel, the size of sunlight and weather data.

When multiple solar panels according to the present invention are installed, the sunlight absorption rate can be improved by controlling the rotational angle of solar panels.

In addition, solar cells or solar panels can be correctly rotated to a desired angle according to the elevation of the sun and its azimuth.

In addition, according to the present invention, the error that can occur due to the installation location, especially due to installation direction of solar panel which contains said solar cell can be corrected and consequently, the sunlight absorption rate can be improved.

Solar power generation apparatus and its tracking method, according to the present invention where using one or more solar cells to absorb sunlight, is characterized by controlling the constant angle of said solar cell to sunlight based on the differential angle between installation direction of said solar cell and true north. In here, said constant angle is either the angle where the sun is perpendicular to said solar cell's plane or the angle which is determined by a combination of one or more conditions from time of sunrise, time of sunset, the distance between solar panels, location of solar panel, size of sunlight and weather data.

From here on, the solar power generation apparatus and its tracking method, according to the present invention, will be explained with the attached drawings.

As illustrated in FIG. 1, the solar power generation apparatus and its tracking method according to the present invention is comprised of one or more solar panels (100) which contains one or more solar cells (110), a rotational angle processing unit (310) which rotates said solar panel to maintain a constant angle of solar cells to said sun depending on the elevation of the sun and its azimuth, a differential angle processing unit (320) which processes the differential angle between the installation direction of said solar panel and true north, a control angle processing unit (330) which processes the control angle based on said rotational angle and differential angle, a drive unit (200) which rotates said solar panel according to said control angle. The said control angle processing unit (330) is characterized by determining whether one of the solar panels is creating shade to the other solar panel and performing a shade avoiding mode when it is determined that shade occurs based on said determination process.

In addition, said control angle processing unit (330) compares said control angle and pre-determined tracking limit angle and outputs said control angle to said drive unit or performs shade avoiding process depending on the result. In addition, a said control angle processing unit (330) outputs said control angle to said drive unit (200) when said control angle is larger than said tracking limit angle and less than 180°—tracking limit angle, and performs shade avoiding mode when said control angle is less than said tracking limit angle or larger than 180°—tracking limit angle.

In here, said shade avoiding mode is a mode which rotates said solar panel to a pre-determined control angle for a pre-determined duration or can be a mode which rotates said panel to a lesser angle than said tracking limit angle to absorb sunlight and when said absorbed sunlight is above a certain sunlight amount it stops said solar panel.

Said constant angle is controlled to be perpendicular between the solar cell plate and sunlight. Or, said constant angle can be determined by the combination from one or two conditions from time of sunrise, time of sunset, the distance between solar panels, the location of solar panel, the size of sunlight and weather data.

Figure 8:
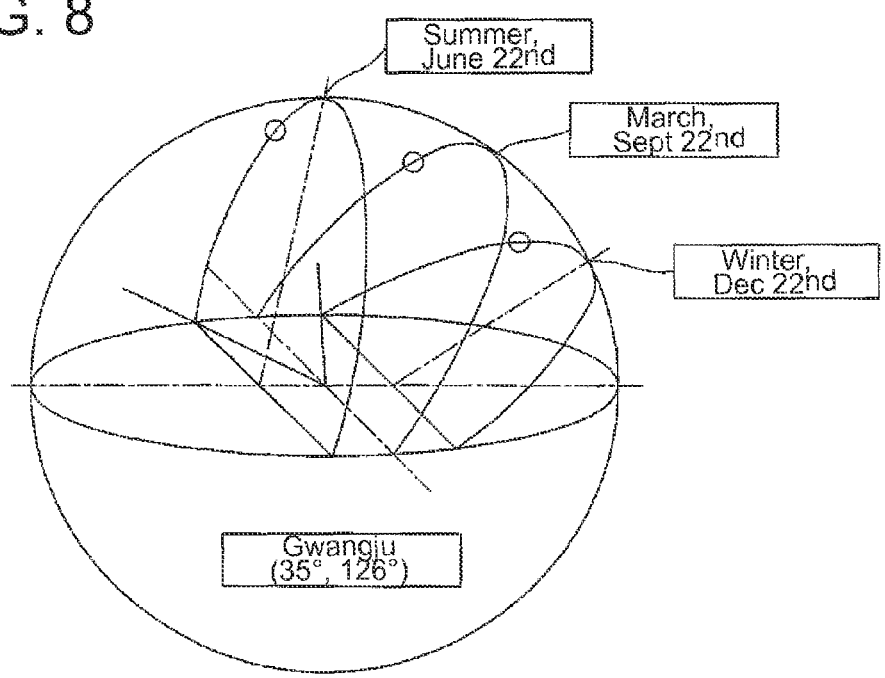
FIG. 8 shows the elevation of the sun depending on the general season.

The location of the sun, for example the elevation of the sun, can be changed depending on the season and time. If you refer to FIG. 8, you can see the different elevation in spring, summer, fall and winter in Gwangju area (in Korea) which is located on latitude N. 35°, longitude E. 126°.

Figure 9:
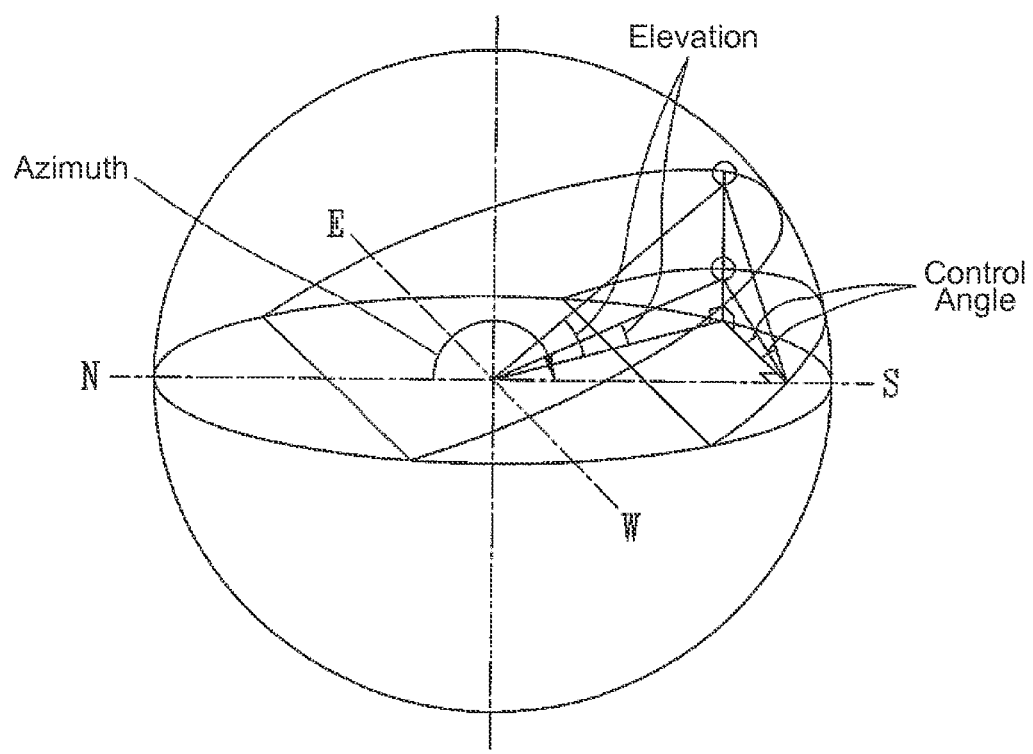
FIG. 9 is a concept diagram to explain the relationship between the elevation of the sun, its azimuth and control angle.

On the other hand, if you refer to FIG. 9, the relationship of the control angle depending on the elevation of the sun and its azimuth, which will be processed according to the present invention, is illustrated.

Said constant angle is controlled to be perpendicular between the solar cell plate and the sun. When the weather condition is normal, the solar cell has to be perpendicular, that is 90°, in order for the cell to receive maximum sunlight. Said constant angle is 90°.

But when the current time is during sunrise or sunset, the location of the sun is relatively low and shade can occur between solar panels due to the location of said sun. In this case, in order to remove or reduce shade experimentally or intentionally, it can be set to a specific degree by the user. In this case, the constant angle may not be 90°.

In addition, said constant angle can change depending on the distance between solar panels, the location of solar panel, size of sunlight and weather data and it also can be set experimentally or intentionally by a combination of one or more variables. For example, when the distance between the solar panels is large or there is no obstacle around it, as the possibility of shade is decreased relatively, the constant angle can be set to 90°. But, if the situation is contrary, by assigning a limited angle, to be described later, the shade can be removed or reduced.

In addition, solar power generation apparatus according to the present invention can also include a communication unit (360) which can communicate wired or wirelessly with an external system. In here, said elevation of the sun and its azimuth can be determined by the received information from external weather observation system through said communication unit. Said external weather observation system can be NOAA (National Oceanic and Atmospheric Administration), astronomy researcher, other external weather related sites or server system. In addition, said communication unit (360) will send and receive data with external weather observation system using wired and wireless communication including internet.

In addition, solar power generation apparatus according to the present invention can also include a memory unit (340) to store information about the date, time, location and its related weather data. In here, said elevation of the sun and its azimuth can be processed based on the date, time, location and its related weather data. On the other hand, the date, time, location and its related weather data can be stored in said memory unit (340) beforehand. In this case, said elevation of the sun and its azimuth can be directly read.

In addition, solar power generation apparatus according to the present invention can also include an input-output unit which can receive instructions from the outside and can send the current status to the outside. In here, said input-output unit can be a display unit which receives instruction through a screen and displays current status to a screen. In other words, the input unit or output unit can generally not only be a keyboard, mouse, key pad, touch pad, monitor, LED (Light Emitting Diode), LCD (Liquid Crystal Display) but also a display unit such as touch screen and depending on the communication method, wireless device such as mobile phone, PDA (Personal Digital Assistant) or smart phone can be used to control instructions or monitoring.

Figure 5:
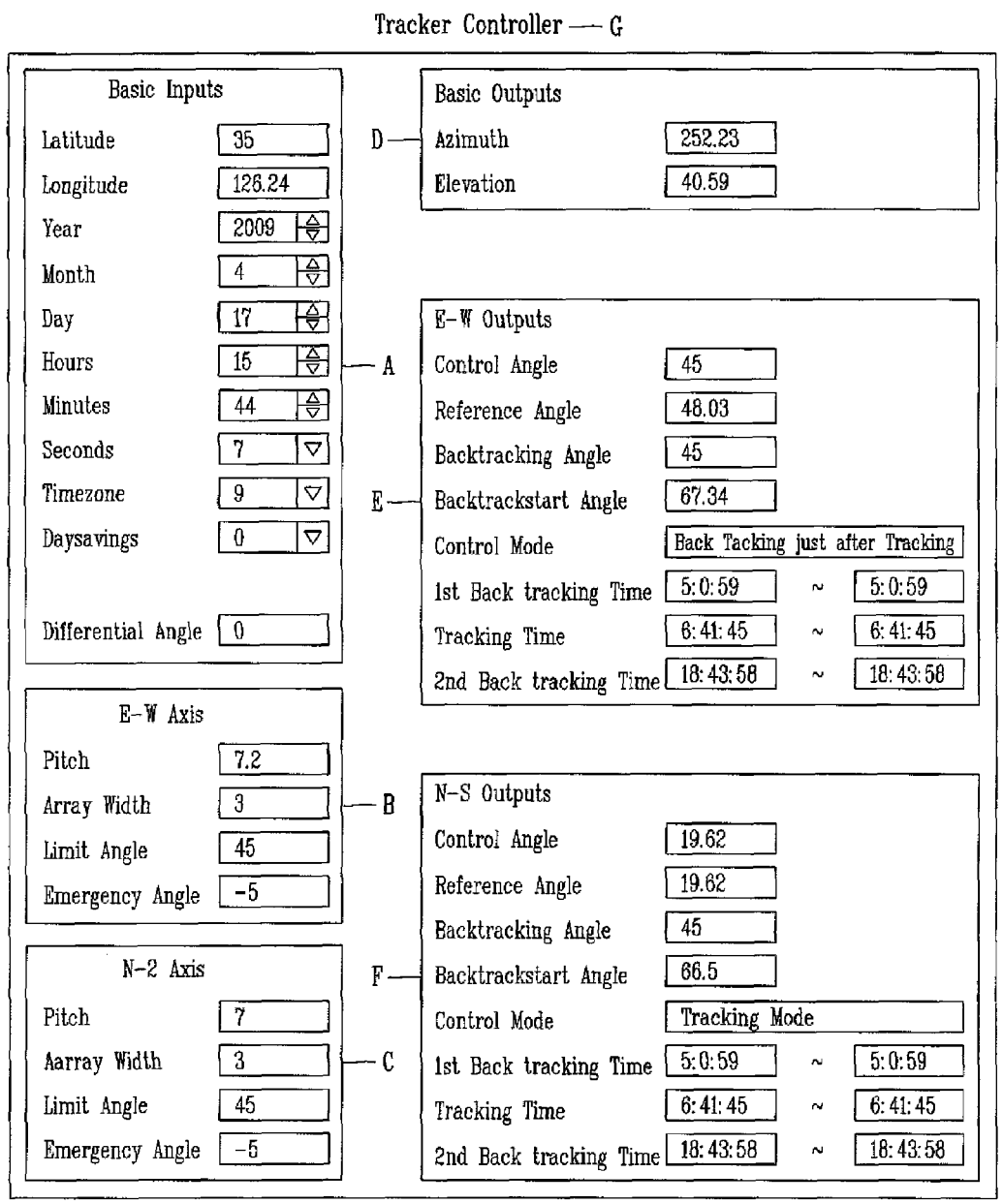
FIG. 5 shows display screen in FIG. 1 and FIG. 2.

FIG. 5 illustrates one example of the display unit of the solar power generation apparatus according to the present invention and the display can be generally organized to have an input portion and output portion. For example, the input portion will be categorized as a basic input area (A) which can be used to input data such as date, time, latitude and longitude, installation parameter (B) to East-West direction and installation parameter (C) to North-South direction. In addition, the output area can comprise of a basic display area (D) which shows the elevation of the sun and its azimuth, area (E) to display rotational angle to East-West direction and control angle, area (F) to display rotational angle to North-South direction and control angle.

Figure 3:
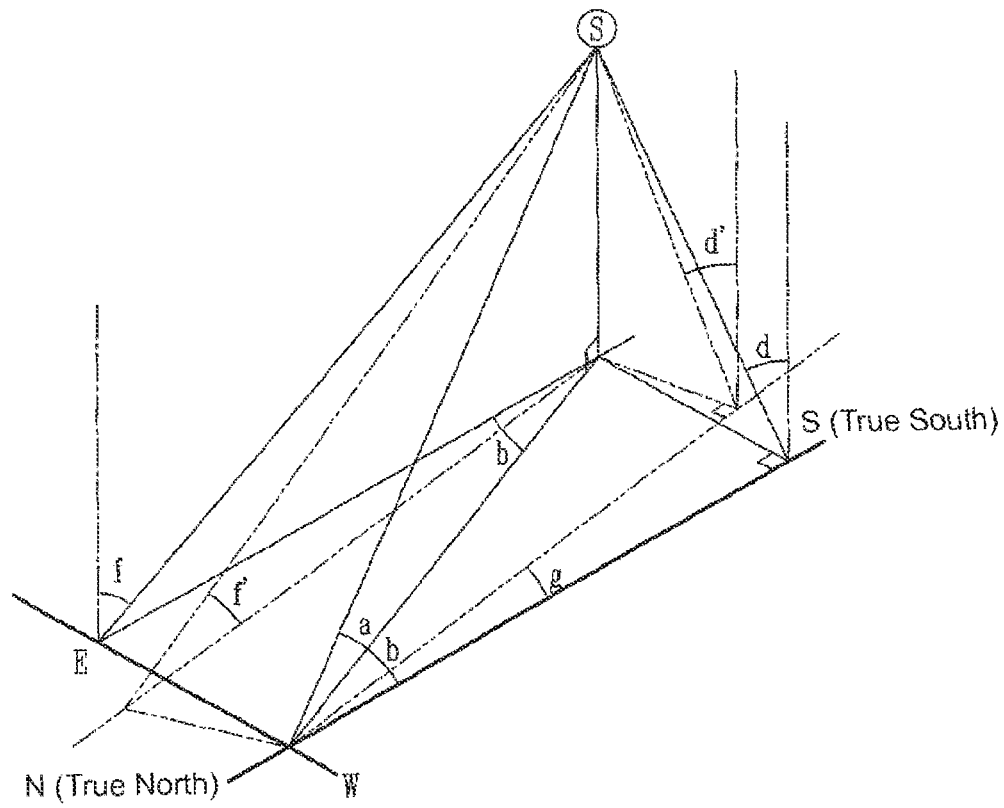
FIG. 3 is a concept diagram to explain the sun tracking operation in FIG. 1 and FIG. 2.

If you refer to FIG. 3, solar power generation apparatus according to the present invention is described. Rotational angle a in FIG. 3 can be calculated by following mathematical formula 1.

$$\tan(90° - d) = \frac{\sin a}{\cos a \times \sin b} \qquad \text{Mathematical Formula 1}$$

In here, a is an elevation, b is 180°—azimuth, d is a rotational angle to east-west direction and f is a rotational angle to south-north direction.

On the other hand, d' is a control angle to east-west direction and f' is a control angle to south-north direction.

That is, when there is a differential angle between the direction of solar panel and true north, a difference arises between the calculated rotational angle and the control angle, which defines the angle in which the solar cell is to be rotated and accordingly, a low absorption of sunlight will occur.

In the solar power generation apparatus according to the present invention, said rotational angle processing unit (310) calculates the rotational angle (d) in relation to the elevation of the sun and its azimuth. Said mathematical formula 1 can be simply used.

After that, said differential angle processing unit (320) processes differential angle (g) between the installation direction of solar panel including solar cells and true north. This differential angle (g) can be processed in various ways. That is, if a solar panel is installed parallel to magnetic north, the difference between magnetic north and true north of the area where the solar panel is installed, that is magnetic declination can be used as differential angle (g). On the other hand, if a solar panel is installed at certain angles to magnetic north, the differential angle (g) can be calculated with consideration of the differential angle between magnetic north and true north and the angle which said panel is faced to magnetic north in the area where the solar panel is installed. For example, if a solar panel is installed parallel to magnetic north in Seoul, the magnetic declination 7° 16' will be a differential angle (g). Differential angle (g) can be processed using grid convergence or GM angle that is the difference between grid north and true north or the difference between grid north and magnetic north.

Said control angle processing unit (330) will determine the control angle (d') using the trigonometric functions with said rotational angle (d) and said differential angle (g).

On the other hand, the control angle (f') in north-south direction can also be calculated using said method. This invention can be applied not only to a one-axis system but also to a two-axis system.

Figure 4:
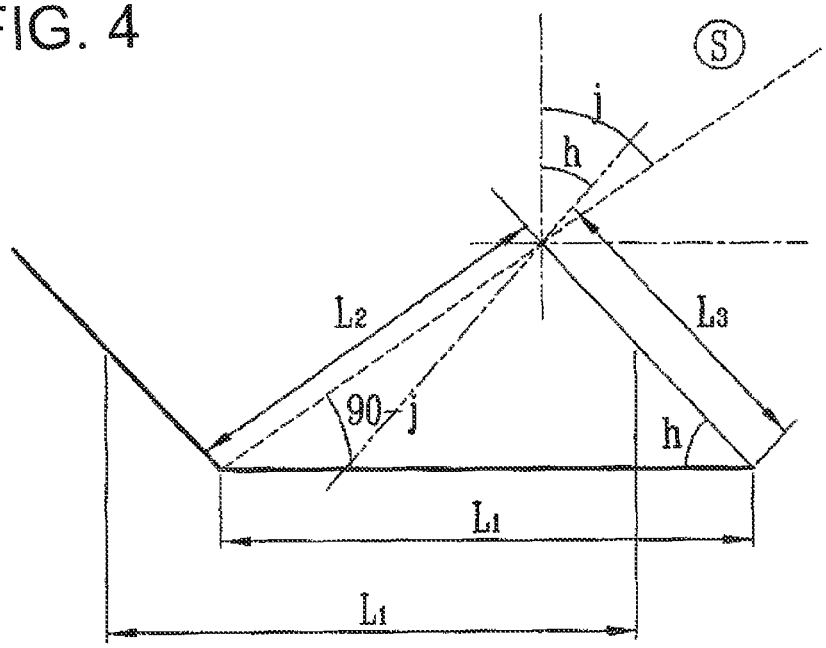
FIG. 4 is a concept diagram to explain shade prevention operation in FIG. 1 and FIG. 2.

Avoiding shade during the solar tracking process and improving the sunlight absorption rate will be briefly explained using FIG. 4. For example, if solar panels are installed according to FIG. 4, the installation distance will be L1, the distance between the solar cells when the solar cell is tracking the sun is L2 and the width of the solar panel where solar cells are installed is L3. In addition, the limiting angle where it stops tracking the sun is h, and the initial control angle to avoid shade is j. Then the control action to avoid shade will occur when angle j is greater than angle h and can be determined by mathematical formula 2 and 3. The said sun tracking method compares the control angle that is processed and said tracking limit angle (h), it is then determined whether to keep tracking the sun by facing the sun at a right angle or to perform a process to avoid shade. On the other hand, tracking limit angle (h) can be set to a constant angle such as 45°. That is when said control angle is between 45° and 135°, it will track the sun and when the control angle is below 45° or above 135°, it can perform an operation to avoid shade.

$$L2^2 = L1^2 + L3^2 - 2 \times L1 \times L3 \times \cos(h) \quad \text{Mathematical Formula 2}$$

$$\cos(90° - j) = \frac{L1^2 + L2^2 - L3^2}{2 \times L1 \times L2} \quad \text{Mathematical Formula 3}$$

Figure 2:
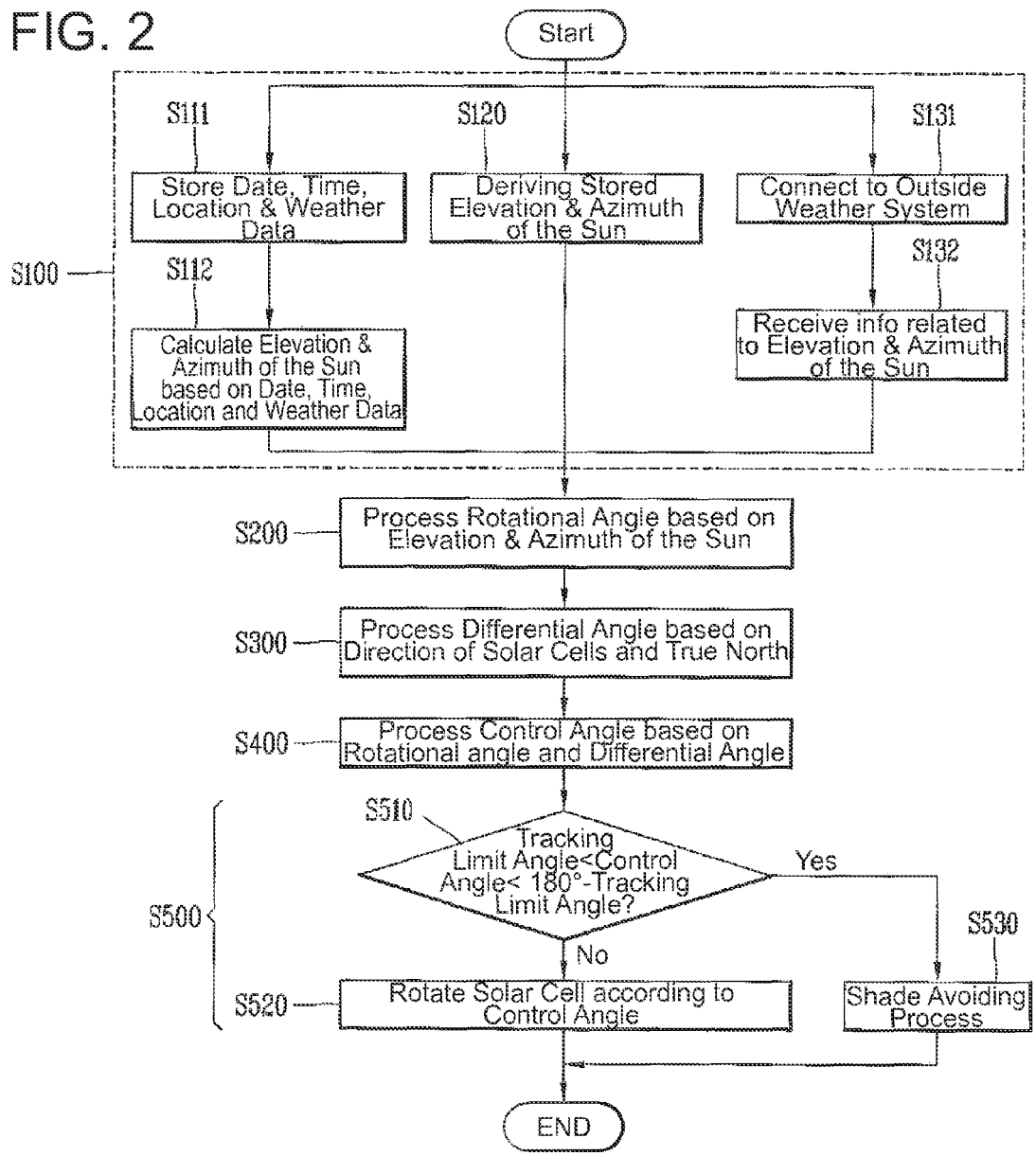
FIG. 2 is a schematic flow chart of the solar tracking system of a solar power generation apparatus according to the present invention.

As illustrated in FIG. 2, in the solar power generation apparatus and its tracking method according to the present invention where one or more solar cells are used to absorb sunlight to track the sun for the solar power generation apparatus includes a rotational angle processing step (S200) to maintain solar cell to keep constant angle to the sun in relation to the elevation of the sun and its azimuth, a differential angle processing step (S300) to process the differential angle between the direction of solar cell and true north, a control angle processing step (S400) to process control angle based on the rotational angle and differential angle, a comparison step (S510) to compare said control angle and pre-determined tracking limit angle and drive step (S520, S530) to change the direction of said solar cell based said comparison result. In here, the structure of the system can be referred to FIG. 1.

In here, said drive step is characterized by changing the direction of solar cell according to said control angle when said control angle is larger than said tracking limit angle and less than 180°—tracking limit angle (S520), performing shade avoiding mode when said control angle is less than said tracking limit angle or larger than 180°—tracking limit angle (S530).

In here, said shade avoiding mode is a mode which rotates said solar panel to a pre-determined control angle for a pre-determined duration or can be a mode which rotates said panel to a lesser angle than said tracking limit angle to absorb sunlight and when said absorbed sunlight is above certain sunlight amount, it stops said solar panel.

In the solar tracking method according to the present invention, said elevation of the sun and its azimuth can be determined by the received information from an external weather observation system or can be determined based on pre-stored, date, time, location and its related weather data or can be determined based on date, time, location and its related weather data.

That is, the solar tracking system according to the present invention pre-stores date, time, location and its related weather data (S111), the elevation of the sun and its azimuth will be processed based on the said stored date, time, location and its related weather data (S112).

In addition, the solar tracking system according to the present invention pre-stores the elevation of the sun and its azimuth based on the date, time, location and its related weather data and derives its information (S120).

In addition, the solar tracking system according to the present invention connects to an external weather observation system (S131) and receives information about the elevation of the sun and its azimuth from the connected external weather observation system (S132). Said external weather observation system can be NOAA (National Oceanic and Atmospheric Administration), astronomy researcher, other external weather related sites or server system. In addition, it will send and receive data with external weather observation system using wired and wireless communication including internet.

The location of the sun, for example the elevation of the sun, can be changed depending on the season and time. If you refer to FIG. 8, you can see the different elevation in spring, summer, fall and winter in Gwangju area (in Korea) which is located in latitude N. 35°, longitude E. 126°.

On the other hand, if you refer to FIG. 9, the relationship of the control angle depending on the elevation of the sun and its azimuth which will be processed according to the present invention is illustrated.

In addition, the solar tracking system's said constant angle, according to the present invention, is either the sun perpendicular to the solar cell plane or the angle which is determined by a combination of one or more conditions from time of sunrise, time of sunset, the distance between solar panels, location of solar panel, size of sunlight and weather data. Said constant angle is controlled to have said solar cell's plane to be perpendicular to said sunlight.

Said constant angle is controlled to be perpendicular between the solar cell plate and the sun. When the weather condition is normal, the solar cell has to be perpendicular, that is 90°, in order for the cell to absorb the maximum amount of sunlight. Said constant angle is 90°.

But when the current time is during sunrise or sunset, the location of the sun is relatively low and shade can occur between solar panels due to the location of said sun. In this case, in order to remove or reduce shade, it can be set to a specific angle by the user experimentally or intentionally. In this case, the constant angle may not be 90°.

In addition, said constant angle can change depending on the distance between solar panels, the location of, solar panel, size of sunlight and weather data and it also can be set experimentally or intentionally by a combination of one or more variables. For example, when the distance between solar panels is large or there is no obstacle around it, as the possibility of shade is decreased relatively, the constant angle can be set to 90°. But, if the situation is contrary, by assigning a limiting degree to be described later, it can remove or reduce the shade.

Solar tracking method will be explained by referring to FIG. 3. The rotational angle a can be calculated by a mathematical formula 4.

$$\tan(90° - d) = \frac{\sin a}{\cos a \times \sin b} \qquad \text{Mathematical Formula 4}$$

In here, a is an elevation, b is 180°—azimuth, d is a rotational angle to east-west direction and f is a rotational angle to south-north direction.

On the other hand, d' is a control angle to east-west direction and f' is a control angle to south-north direction.

That is, when there is a differential angle between the direction of solar panel and true north, a difference arises between the calculated rotational angle and the control angle, which defines the angle in which the solar cell is to be rotated and accordingly, a low absorption of sunlight will occur. In the present invention, said rotational angle processing unit (310) first calculates rotational angle (d) in relation to the elevation of the sun and its azimuth. Simply said mathematical formula 1 can be used (S200).

After that, said differential angle processing unit (320) processes differential angle (g) (S300) between the installation direction of the solar panel including solar cells and true north. This differential angle (g) can be processed in various ways. That is, if a solar panel is installed parallel to magnetic north, the difference between magnetic north and true north of the area where the solar panel is installed, that is magnetic declination can be used as a differential angle (g). On the other hand, if a solar panel is installed at a certain angle to magnetic north, the differential angle (g) can be calculated with consideration to the differential angle between magnetic north and true north and the angle which said panel is faced to magnetic north in the area where the solar panel is installed. For example, if a solar panel is installed parallel to magnetic north in Seoul, the magnetic declination 7° 16' will be a differential angle (g). Differential angle (g) can be processed using grid convergence or GM angle that is the difference between grid north and true north or the difference between grid north and magnetic north.

Said control angle processing unit (330) will determine the control angle (d') (S400) using the trigonometric functions with said rotational angle (d) and said differential angle (g).

When solar panel with solar cells are controlled by said determined control angle (d'), more amount of sunlight can be absorbed (S500).

On the other hand, the control angle (f') in north-south direction can also be calculated using said method. This invention can be applied not only to a one-axis system but also to a two-axis system.

Avoiding shade during the solar tracking process and improving the sunlight absorption rate will be briefly explained using FIG. 4. For example, if solar panels are installed according to FIG. 4, the installation distance will be L1, the distance between the solar cells when the solar cell is tracking the sun is L2 and the width of the solar panel where solar cells are installed is L3. In addition, the limiting angle where it stops the sun tracking is h, and the initial control angle to avoid shade is j. Then the control action to avoid shade will occur when angle j is greater than angle h and it can be determined by mathematical formula 5 and 6. The said sun tracking method compares the control angle that is processed and said tracking limit angle (h), it is then determined whether to keep tracking the sun by facing the sun at a right angle or to perform a process to avoid shade. On the other hand, tracking limit angle (h) can be set to constant angle such as 45°. That is when said control angle is between 45° and 135°, it will track the sun and when the control angle is below 45° or above 135°, it can perform an operation to avoid shade.

$$L2^2 = L1^2 + L3^2 - 2 \times L1 \times L3 \times \cos(h) \qquad \text{Mathematical Formula 5}$$

$$\cos(90° - j) = \frac{L1^2 + L2^2 - L3^2}{2 \times L1 \times L2} \qquad \text{Mathematical Formula 6}$$

Figure 6:
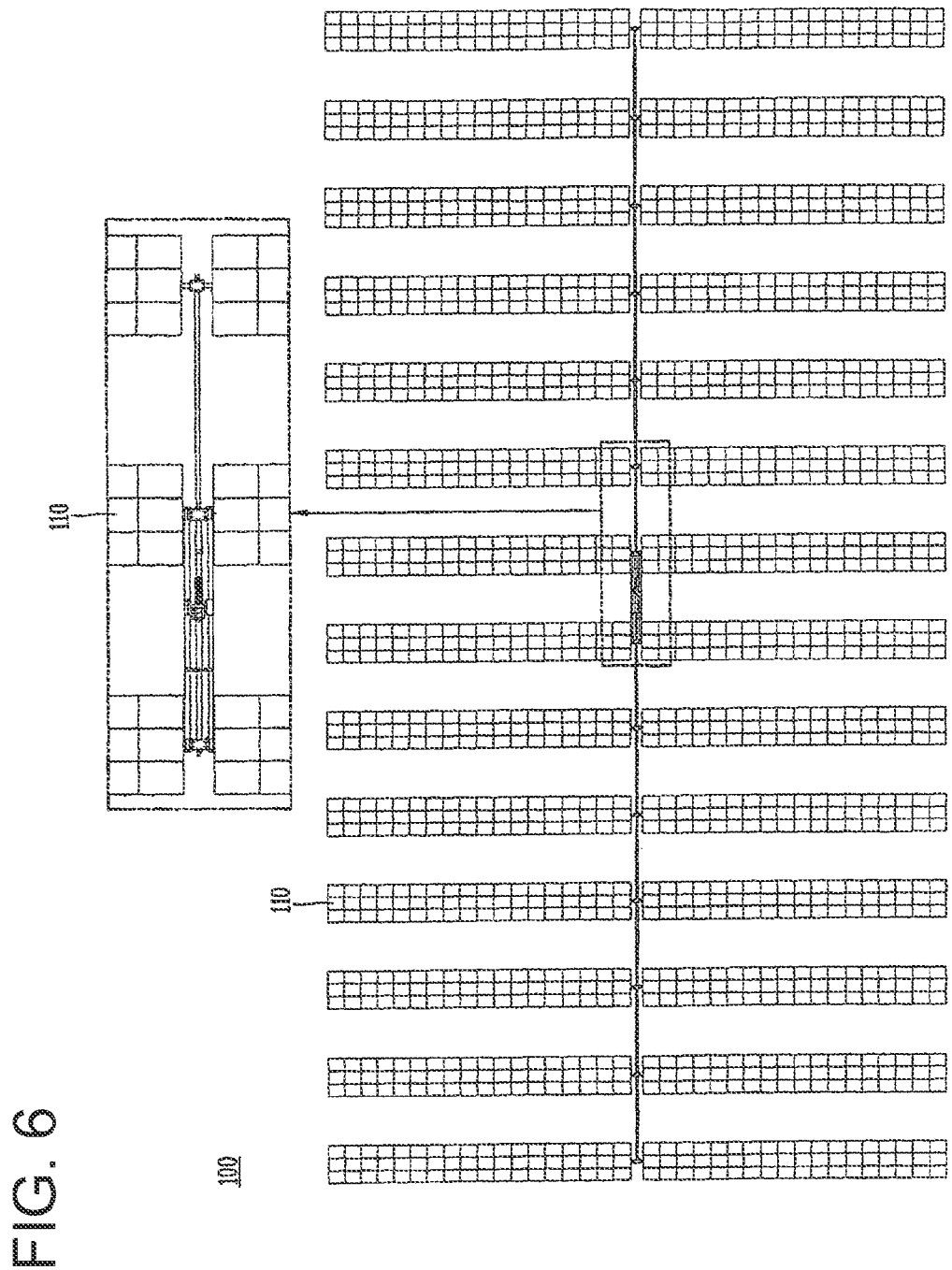
FIG. 6 shows one example of a solar panel in FIG. 1 and FIG. 2.
Figure 7:
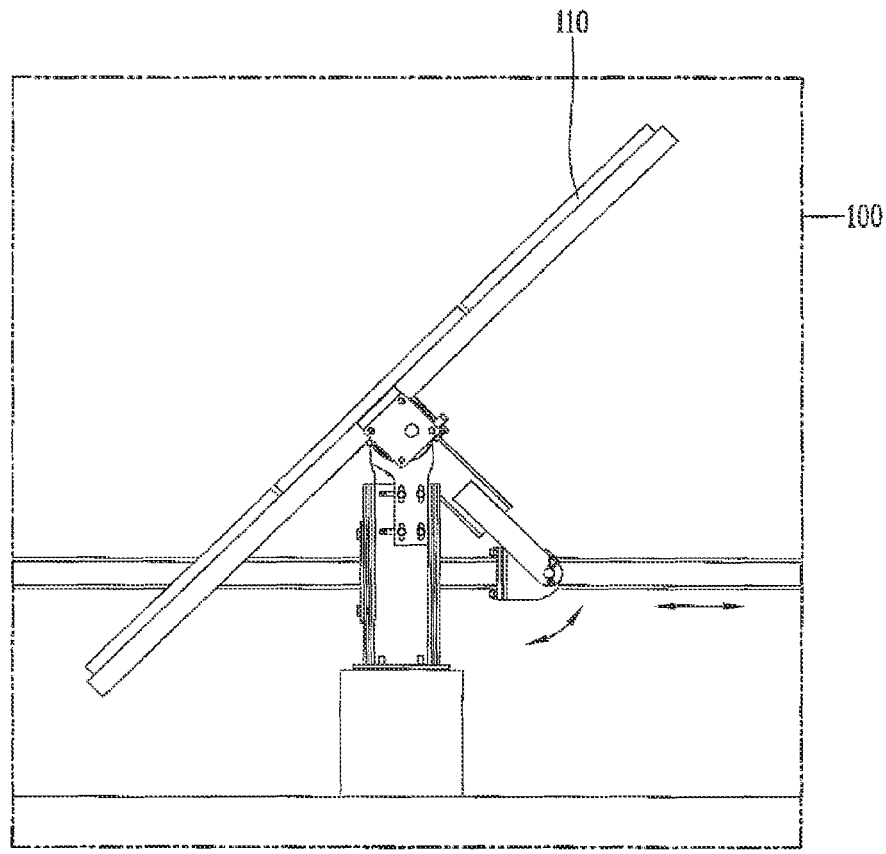
FIG. 7 shows detailed structure of solar panels in FIG. 6.

FIG. 6 illustrates one example of solar panel of FIG. 1 and FIG. 2 and FIG. 7 illustrates a detailed diagram of solar panel in FIG. 6. Solar panel will be explained by referring to FIG. 6 and FIG. 7 from now on. FIG. 6 is an expanded view of FIG. 1 and the solar panels with solar cells are placed in 14 rows and they are connected to be controlled by one control device (300). The structure in FIG. 6 and FIG. 7 can be modified appropriately as long as it does not deviate from the substance of the present invention.

If you refer to FIG. 6, solar panels placed in multiple rows are attached to a torque tube. In FIG. 6, solar panels are placed to have 14 rows and under each row of solar panels a torque tube is placed. On the other hand, a motor is located in the center of the rows of solar panels. Said motor generates power to rotate torque tube where solar panels are attached and transmits the power. A connection unit to transmit the power generated from said motor is placed to pierce each row of said solar panels. Specifically, said connection unit is extended to intersect the center of the solar panel from under said torque tube and it is connected to each torque tube by a lever arm. Said lever is not only performing a function of supporting said connecting unit but also converts the reciprocal movement of connecting unit to rotational movement of said torque tube.

If you refer to FIG. 6 and FIG. 7, said connecting unit is placed in an east-west direction. Said control device (300) controls the control angle of said solar panel and accordingly it controls said drive unit (200) so that it controls solar panel (100) to be placed in a predetermined angle.

As described previously, the solar tracking system and its tracking method, according to the present invention, has an error due to installation location especially installation direction of solar panels with solar cells can be compensated and accordingly by processing and determining the control angle, solar cell or solar panels can be rotated to a desired direction and sunlight absorption rate. When multiple solar panels are placed according to the present invention, the sunlight absorption rate can be increased by controlling the solar panels in a specific rotational angle.

On the other hand, a solar tracking method can be used to use a program which does not deviate from a solar tracking system according to the present invention and the tracking method thereof, and it can increase the convenience of the user by storing this program in the storage media.

The invention claimed is:
1. A solar power generation apparatus comprising:
a solar panel that houses a solar cell;
a rotational angle processing unit that processes a rotation angle to rotate the solar panel to maintain a constant angle to the sun depending on the elevation of the sun and its azimuth;
a differential angle processing unit that processes a differential angle between the installation direction of the solar panel and true north;
a control angle processing unit that processes a control angle based on the rotational angle;

a drive unit that rotates the solar panel according to the control angle; and a control angle processing unit that determines whether the solar panel is creating shade to another solar panel and performs a shade avoiding process when it determines that shade is occurring based on the result of the decision.

2. The solar power generation system of claim 1 wherein the control angle processing unit compares the control angle to a pre-determined tracking limit angle and outputs the control angle to the drive unit or performs a shade avoiding process depending on the comparison result.

3. The solar power generation system in claim 1 wherein the control angle processing unit outputs the control angle to the drive unit when the control angle is larger than the tracking limit angle and less than 180°, and performs a shade avoiding mode when the control angle is less than the tracking limit angle or larger than 180°.

4. The solar power generation system in claim 1 wherein the shade avoiding mode is adapted to rotate the solar panel to a pre-determined control angle for a pre-determined time.

5. The solar power generation system in claim 1 wherein the shade avoiding mode absorbs sunlight by rotating to a control angle less than the tracking limit angle and stops the solar panel when the absorbed sunlight is greater than a certain light amount.

6. The solar power generation system in claim 1 further comprising a communication unit which communicates with an external system through wired and wireless communication and the direction of the sun and its azimuth is determined by received information from an outside weather observation system through the communication unit.

7. The solar power generation system in claim 1 further comprising an additional memory unit which stores the date, time, location and its related weather and it is processed based on the date, time, location and its related weather data which are stored in the memory unit.

8. The solar power generation system in claim 7 wherein the memory unit is pre-set with the elevation of the sun and its azimuth based on the date, time, location, and its related weather data.

9. The solar power generation system in claim 1 wherein an additional input-output unit receives instructions from the outside and sends the current status to the outside.

10. The solar power generation system in claim 9 wherein the input-output unit includes a display unit that receives instructions through the screen and displays current status through the screen.

11. The solar tracking method of solar power generation apparatus in claim 1 wherein the constant angle being perpendicular between the solar panel plane and the sun is determined by a combination of one or more components from the time of sunrise, time of sunset, distance between solar panels, location of solar panel, size of sunlight and its related weather data.

12. A solar tracking method of solar power generation apparatus that uses a solar cell, the method comprising:

processing a rotational angle to maintain the solar cell in a constant angle to the sun based on the elevation of the sun and its azimuth;

processing a differential angle between the direction of the solar cell and true north;

processing a control angle based on the rotational angle and differential angle;

comparing the control angle and pre-determined tracking limit angle;

driving the solar cell to change the solar cell angle according to the control angle.

13. The solar tracking method of solar power generation apparatus in claim 12 wherein the control angle processing unit outputs the control angle to the drive unit when the control angle is larger than the tracking limit angle and less than 180°, and performs a shade avoiding mode when the control angle is less than the tracking limit angle or larger than 180°.

14. The solar tracking method of solar power generation apparatus in claim 12 wherein the shade avoiding process is a mode for rotating the solar panel to a pre-determined control angle for a pre-determined time.

15. The solar tracking method of solar power generation apparatus in claim 12 wherein the shade avoiding process is a mode that rotates the panel to a lesser angle than the tracking limit angle to absorb sunlight and stops the panel when the absorbed sunlight reaches a certain sunlight amount.

16. The solar tracking method of solar power generation apparatus in claim 12 wherein the elevation of the sun and its azimuth are determined based on the received information from an outside weather observation system.

17. The solar tracking method of solar power generation apparatus in claim 12 wherein the elevation of the sun and its azimuth are processed based on the pre-stored date, time, location and its related weather data.

18. The solar tracking method of solar power generation apparatus in claim 12 wherein the elevation of the sun and its azimuth are characterized by being pre-determined based on date, time, location and related weather data.

19. The solar tracking method of solar power generation apparatus in claim 12 wherein the constant angle is perpendicular between the solar panel plane and the sun being determined by a combination of one or more components from the time of sunrise, time of sunset, distance between solar panels, the location of solar panel, size of sunlight and related weather data.

* * * * *